(12) United States Patent
Tiwari et al.

(10) Patent No.: US 7,387,960 B2
(45) Date of Patent: Jun. 17, 2008

(54) DUAL DEPTH TRENCH TERMINATION METHOD FOR IMPROVING CU-BASED INTERCONNECT INTEGRITY

(75) Inventors: Rajesh Tiwari, Plano, TX (US);
Russell Fields, Richardson, TX (US);
Scott A. Boddicker, Plano, TX (US);
Andrew Tae Kim, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 775 days.

(21) Appl. No.: 10/663,948

(22) Filed: Sep. 16, 2003

(65) Prior Publication Data

US 2005/0059189 A1 Mar. 17, 2005

(51) Int. Cl.
*H01L 21/4763* (2006.01)
(52) U.S. Cl. ...................... 438/637; 257/762
(58) Field of Classification Search ............... 257/751, 257/775, 758, 762; 438/700, 637
See application file for complete search history.

(56) References Cited

U.S. PATENT DOCUMENTS

| 6,433,432 | B2 * | 8/2002 | Shimizu .................... 257/758 |
| 6,468,894 | B1 | 10/2002 | Yang et al. |
| 6,566,242 | B1 | 5/2003 | Adams et al. |
| 6,734,090 | B2 * | 5/2004 | Agarwala et al. ........... 438/598 |
| 2002/0011671 | A1 | 1/2002 | Shimizu |
| 2003/0139031 | A1 | 7/2003 | Fukada et al. |
| 2003/0148604 | A1 | 8/2003 | Lin et al. |
| 2003/0227089 | A1 * | 12/2003 | Watanabe et al. ........... 257/758 |

FOREIGN PATENT DOCUMENTS

EP 1 326 276 A2 7/2003

* cited by examiner

*Primary Examiner*—Phat X Cao
(74) *Attorney, Agent, or Firm*—Frederick J. Telecky, Jr.; Wade J. Brady, III

(57) ABSTRACT

A trench is formed in a low K dielectric (100) over a plurality of vias (120) also formed in the low K dielectric layer (100). The vias are separated by a distance of less than $X_V$ and the edge of the trench is greater than $X_{TO}$ from the edge α of the via closest to the edge of the trench. The trench and vias are subsequently filled with copper (150), (160) to form the interconnect line.

4 Claims, 4 Drawing Sheets

DUAL DEPTH TRENCH TERMINATION METHOD FOR IMPROVING CU-BASED INTERCONNECT INTEGRITY

FIELD OF THE INVENTION

The invention is generally related to the field of integrated circuits and more specifically to a dual trench depth termination method for improving the integrity of Cu-based semiconductor interconnects.

BACKGROUND OF THE INVENTION

High performance integrated circuits utilize low K dielectric layers and copper metal to form the lines that interconnect the various electronic devices that comprise the circuit. The copper interconnect lines comprise copper formed in trenches and vias in the low K dielectric material.

Illustrated in FIG. 1 is a cross section diagram of a typical copper interconnect structure showing copper delamination. Copper delamination is a major problem that affects the reliability and operation of the integrated circuit. As shown in FIG. 1, a dielectric layer 10 is formed over a semiconductor. Electronic devices such as transistors, capacitors, and diodes will be formed in the semiconductor. In addition there may be any number of intervening layers and structures between the semiconductor and the dielectric layer 10. The semiconductor and any intervening layers have been omitted for clarity. A copper layer 20 is formed in the dielectric layer using known methods. A barrier layer 30 is formed on the copper layer and a second dielectric layer 40 is formed over the barrier layer. Using known methods such as the dual damascene method, copper lines 60 and vias 50, 51 are formed in the second dielectric layer. During subsequent processing various stresses will be formed in the copper interconnect structure. Currently this stress can lead to the delamination as shown in FIG. 1. As shown in the Figure, the copper via 51 has lifted away from the underlying copper layer 20 and is no longer making electrical contact with said layer. This lifting of the via from the underlying copper line is referred to as via delamination (or delamination). This delamination can cause the integrated circuit to become inoperable and fail. There is therefore a need for a method to form copper interconnect structures that will reduce and/or eliminate delamination. The instant invention addresses this need.

SUMMARY OF THE INVENTION

A dielectric layer is formed over a semiconductor. Any number of intervening layers can be formed between the semiconductor and the dielectric layer. A plurality of vias, separated by a minimum distance $X_V$, is formed in the dielectric layer to allow the subsequently formed copper layer to contact an underlying copper layer. A trench is formed in the dielectric layer over the plurality of vias with an edge that extends a minimum distance of $X_{TO}$ from the edge α of the via closest to the edge of the trench. The trench can comprise a depth $d_1$ in the region containing the vias and a depth $d_2$ at the edge of the trench. In general the condition $d_1 > d_2$ will apply to the depths of the trench. The trench and vias will be filled with copper to form a copper interconnect line. The minimum overhang of the copper line will reduce and/or eliminate the copper delamination the currently occurs.

Figure 1:
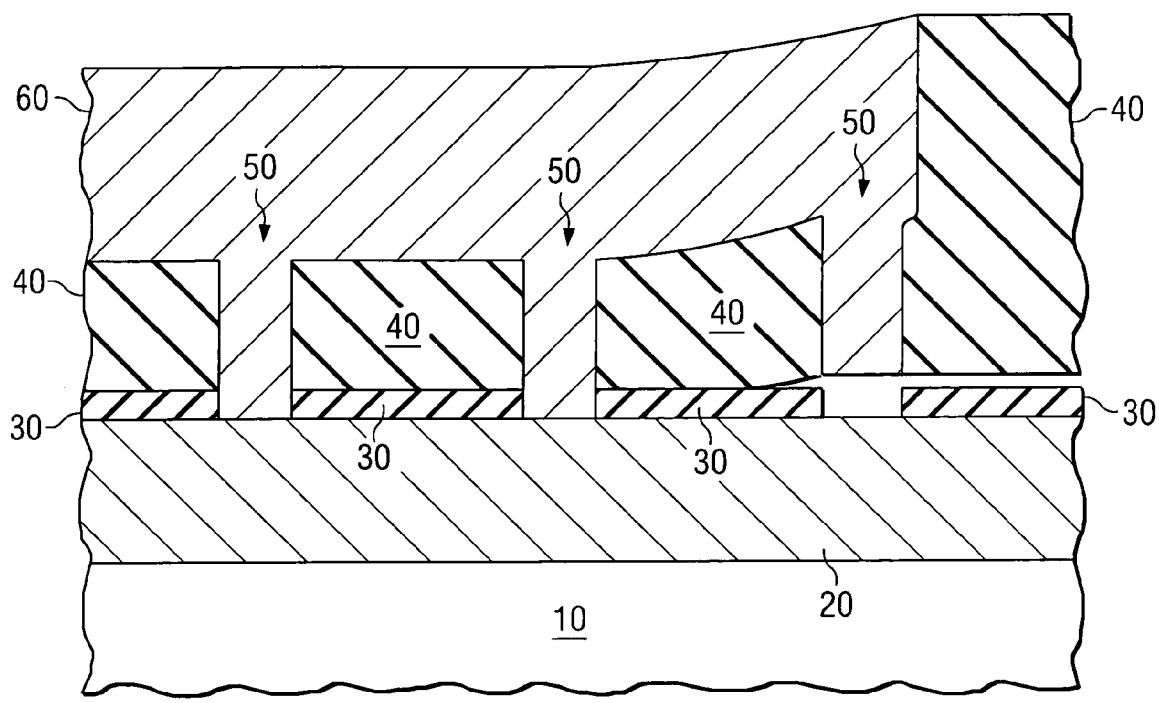
FIG. 1 shows the cross-section of a copper interconnect structure showing delamination according to the prior art.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIG. 2(a) to FIG. 2(f), the instant invention can be utilized in many semiconductor device structures. The methodology of the instant invention provides a solution to forming reliable copper interconnect structures.

Figure 2A:
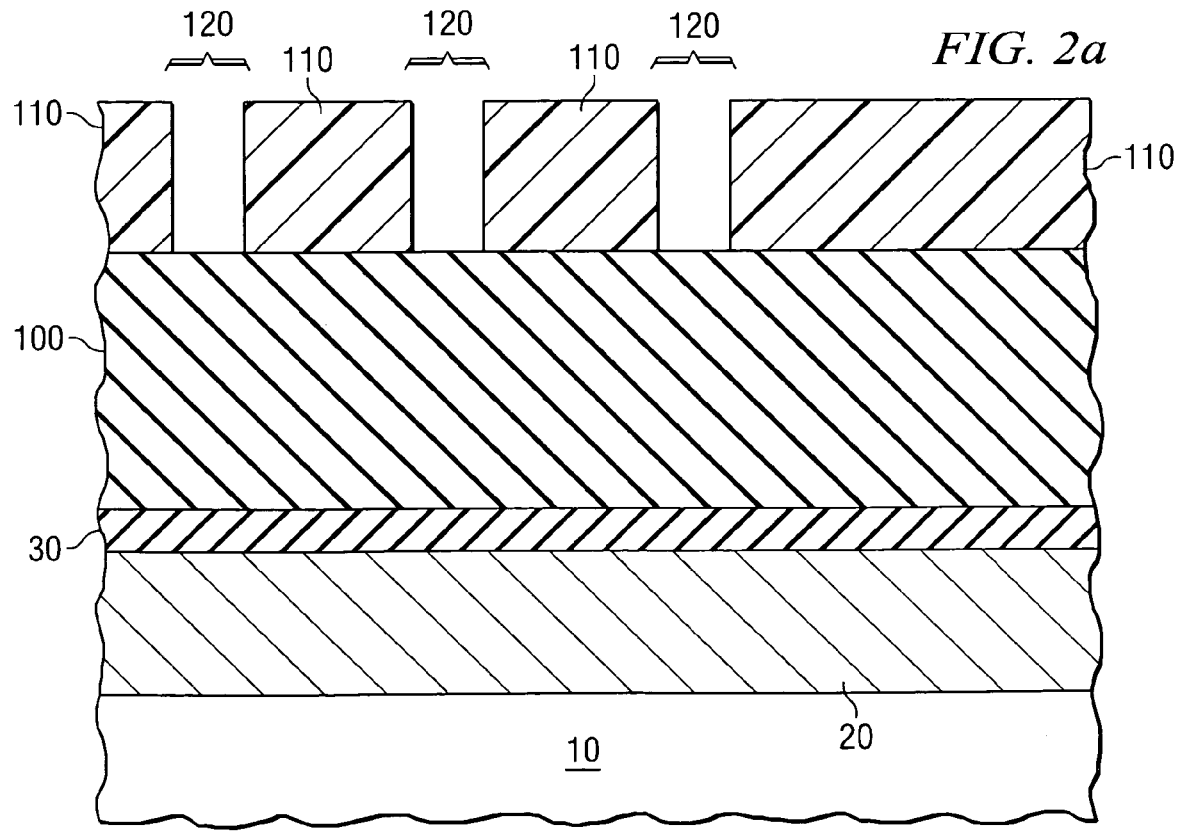
FIGS. 2(a)-2(d) are cross-sectional diagrams showing an embodiment of the instant invention.

An embodiment of the instant invention will now be described by referring to FIG. 2(a) to FIG. 2(d). As shown in FIG. 2(a), a copper metal layer 20 is formed on a dielectric layer 10. The dielectric layer 10 is formed over a semiconductor. Electronic devices such as transistors, capacitors, and diodes will be formed in the semiconductor. In addition there may be any number of intervening layers and structures between the semiconductor and the dielectric layer 10. The semiconductor and any intervening layers have been omitted for clarity. Following the formation of the copper layer 20, a barrier layer 30 is formed on the copper layer 20. This barrier layer can comprise silicon nitride or any other suitable dielectric material. A dielectric layer 100 is formed on the barrier layer. In an embodiment the dielectric layer 100 can comprise a low dielectric constant (herein after low K dielectric) material. In this disclosure low K refers to dielectric material with a dielectric constant of 3.8 and below. This should be compared with silicon oxide that has a dielectric constant of 3.9. Some examples of low K dielectrics that can be used to form the dielectric layer 100 are fluorine-doped silicate glass (FSG), silsesquioxanes, and organosilicate glass (OSG). OSG material can be formed by chemical vapor deposition (CVD) using organosilane precursors or spin-on using silsesquioxanes. Other low K material that can be used to form layer 100 include, but is not limited to, poly(arylene ether), parylene, fluoropolymer, fluorinated amorphous carbon, diamondlike carbon, porous silica, mesoporous silica, porous silsesquioxane, porous polyimide, and porous poly(arylene ether). Following the formation of the dielectric layer 100, a patterned photoresist layer 110 is formed on the dielectric layer to define a pattern for the etching of the vias 120.

Figure 2B:
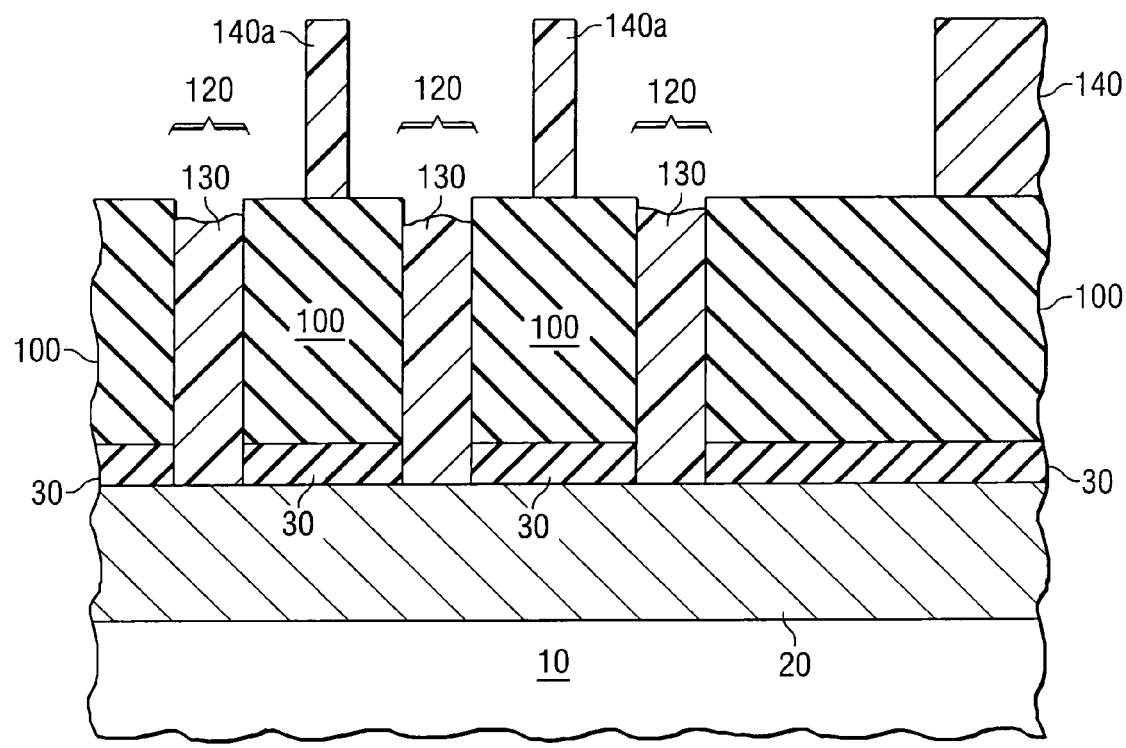

Shown in FIG. 2(b) is the dielectric structure of FIG. 2(a) following the etching of the vias 120 in the dielectric layer 100. Following the etching of the vias, a material 130 is used to fill the vias 120. In an embodiment of the instant invention the material 130 that is used is the same material used to form the backside antireflective coating (BARC) layer. In addition, many different types of organic and inorganic material can be used to fill the via. Following the filling of the vias 120 with a material 130, a second patterned photoresist layer comprising 140 and 140a is formed on the dielectric layer to define the trench. The portion of the patterned photoresist layer 140a is optional. Using the patterned photoresist layer 140, 104a as an etch mask, the trench structure is formed in the dielectric layer using a dry etching method. In this disclosure dry etching refers to an etch process the does not use liquid chemical etching but instead comprises a plasma assisted etching process.

Figure 2C:
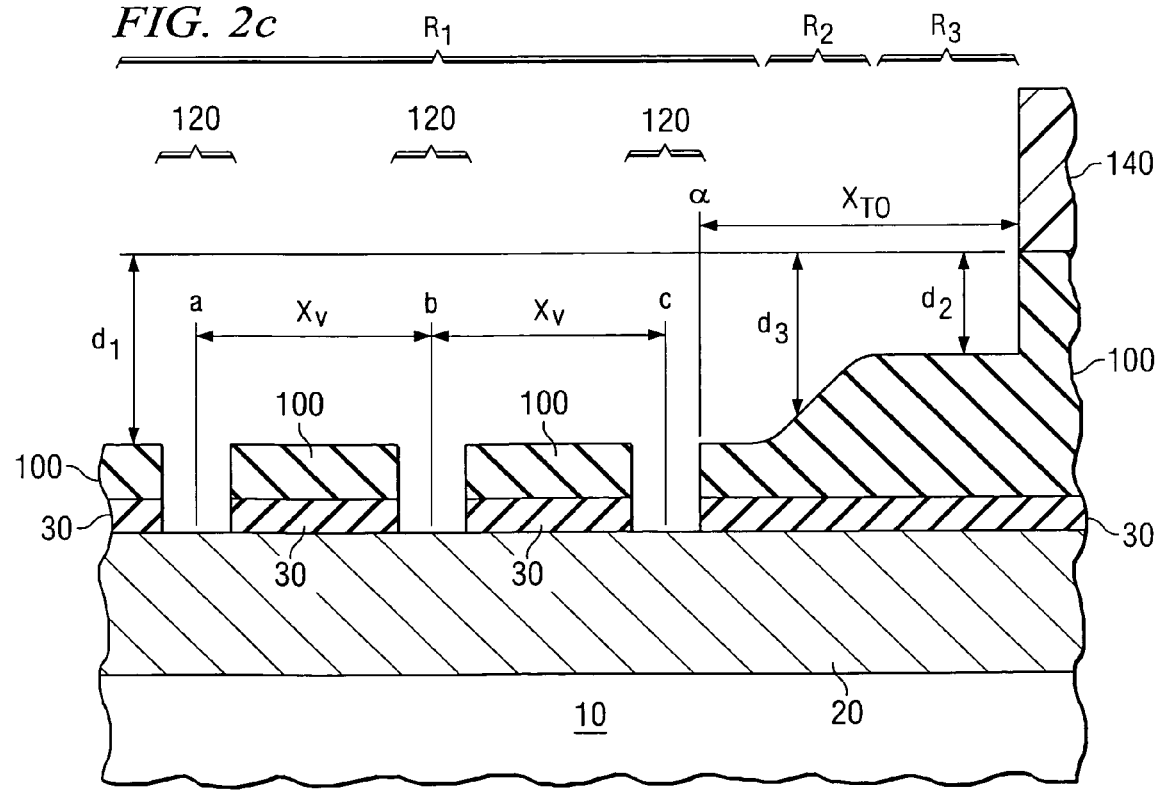
Figure 2D:
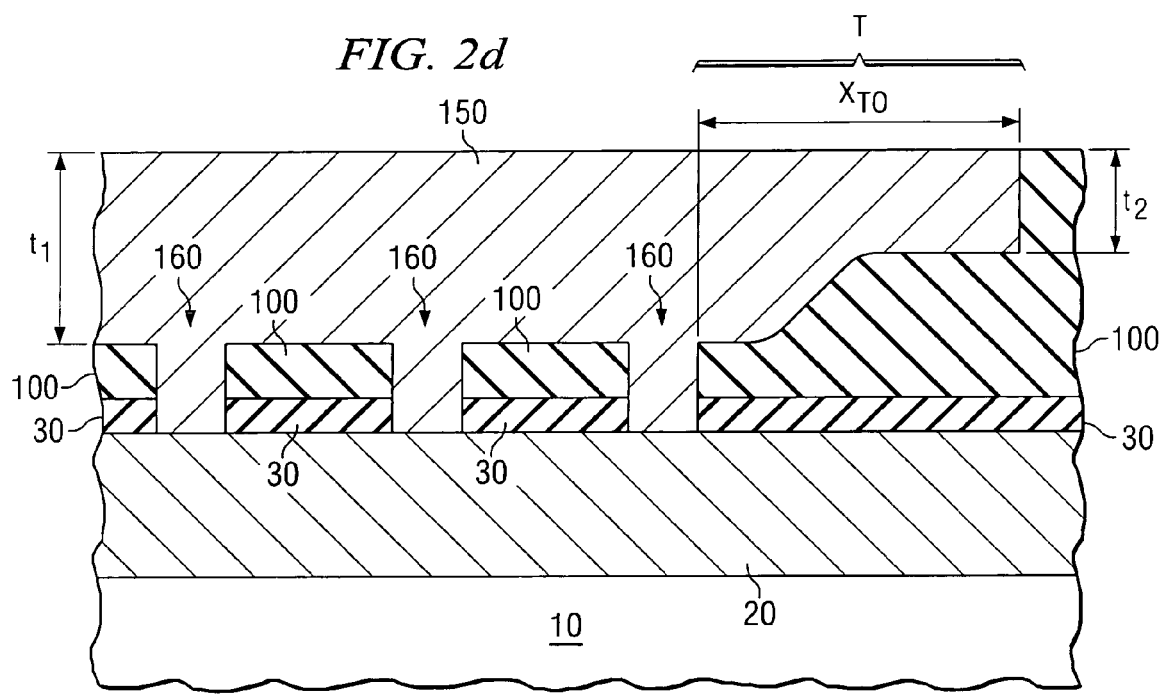

Shown in FIG. 2(c) is the structure of FIG. 2(b) following the etching of the trench in the dielectric layer 100. In FIG. 2(c) the portion of the patterned resist layer 140a was not present or was removed during the trench etching process. As shown in FIG. 2(c), a dual depth trench structure is formed. The depth of the trench is measured from the surface of the dielectric layer 100. The first trench depth is $d_1$ and the second trench depth is $d_2$ where $d_1 > d_2$. The region of the trench $R_1$ that comprises the vias 120 is substantially at the depth $d_1$. There is a transition region $R_2$ where the depth of the trench transitions from $d_1$ to $d_2$. The depth of this transition region is designated $d_3$ where $d_2 < d_3 < d_1$. The third region $R_3$ represents the region of the trench where the trench depth is substantially $d_2$. In region $R_1$ of the trench, that comprises the plurality of vias 120, the vias are separated by a distance $X_V$ as shown in FIG. 2(c). In an embodiment of the instant invention the separation $X_V$ of the vias 120 is less than 0.7 um and there are n vias where n>2. In order to reduce the delamination of the copper structures that will subsequently be formed in the vias 120, a minimum trench termination overhand $X_{TO}$ must be included. Such a minimum trench termination overhang $X_{TO}$ is shown in FIG. 2(c) and is defined as the distance from the edge α of the via closest to the end of the trench to the end of the trench. In an embodiment of the instant invention the minimum trench termination overhang $X_{TO}$ is greater than 0.2 um. In a further embodiment of the instant invention the minimum trench termination overhang $X_{TO}$ is greater than 0.35 um. In yet a further embodiment of the instant invention the minimum trench termination overhang $X_{TO}$ is greater than 0.5 um. It should be noted that the trench depth at the end of the trench need not necessarily be $d_2$ as shown in the Figure. It is intended that the instant invention encompass any trench depth from $d_2$ to $d_1$. Following the formation of the trench shown in FIG. 2(c), the remaining patterned photoresist layer 140 is removed and copper 150 and 160 is used to fill the vias and the trench respectively as shown in FIG. 2(d). The copper structure that exists in the minimum trench overhand $X_{TO}$ will prevent the copper structure 150, 160 from delaminating from the underlying copper layer 20.

Therefore according to an embodiment of the instant invention, a copper layer 150 comprising a plurality of n copper vias 160 (where n>2) separated by distance $X_V$ must include a minimum termination copper structure (labeled T in FIG. 2(d)) between the edge of the last via and the end of the copper layer. The length of the minimum copper termination structure is greater than $X_{TO}$ where $X_{TO}$ can be 0.2 um, 0.35 um, or 0.5 um. Furthermore the thickness of the copper layer that comprises the via structures 150 is $t_1$ and the thickness of the minimum termination copper structure T can be any value down to an including $t_2$ as shown in FIG. 2(d).

Figure 2E:
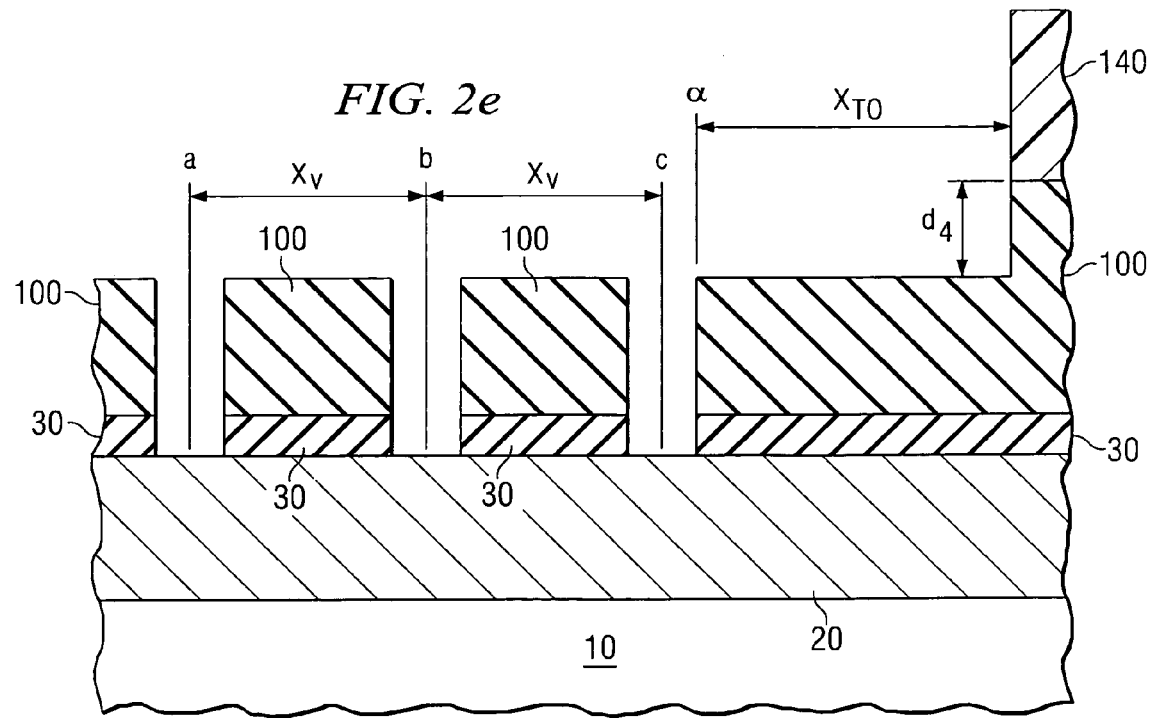
FIGS. 2(e)-2(f) are cross-sectional diagrams showing an embodiment of the instant invention.
Figure 2F:
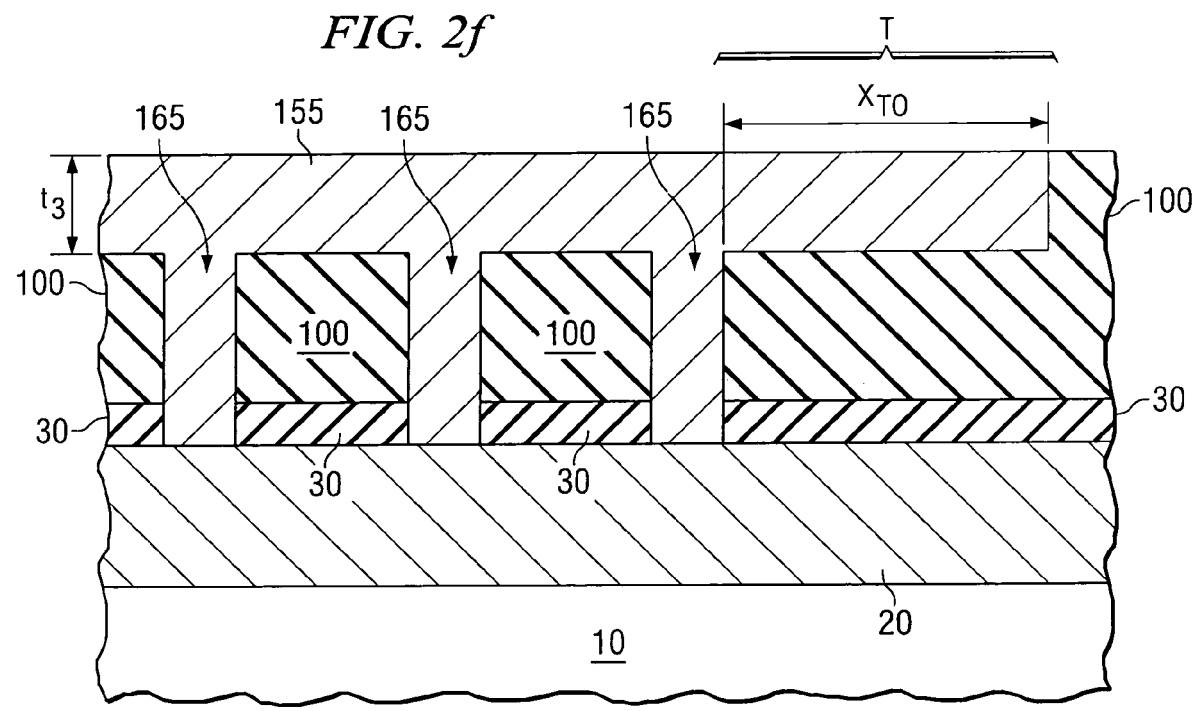

Shown in FIG. 2(e) is a cross section of the trench structure formed when the patterned photoresist structure 140a remains during the trench etching process. In this embodiment the resulting trench depth is substantially uniform at a depth $d_4$. As described previously the vias are separated by a distance $X_V$ where $X_V$ is less than 1.0 um and the number of vias n is greater than 2. As described above, in order to reduce the delamination of the copper that will subsequently be formed in the vias, a minimum trench termination overhand $X_{TO}$ must be included as shown in FIG. 2(e). It is defined as the distance from the edge α of the via closest to the end of the trench to the end of the trench. In an embodiment of the instant invention the minimum trench termination overhang $X_{TO}$ is greater than 0.2 um. In a further embodiment of the instant invention the minimum trench termination overhang $X_{TO}$ is greater than 0.35 um. In yet a further embodiment of the instant invention the minimum trench termination overhang $X_{TO}$ is greater than 0.5 um. Following the formation of the trench shown in FIG. 2(e), the remaining patterned photoresist layer 140 is removed and copper 155 and 165 is used to fill the vias and the trench respectively as shown in FIG. 2(f). The copper structure that exists in the minimum trench overhand $X_{TO}$ will prevent the copper structure 155, 165 from delaminating from the underlying copper layer 20.

Therefore, according to an embodiment of the instant invention, a copper layer 155 comprising a plurality of n copper vias 165 (where n>2) separated by distance $X_V$ must include a minimum termination copper structure (labeled T in FIG. 2(f)) between the edge a of the last via and the end of the copper layer. The length of the minimum copper termination structure is greater than $X_{TO}$ where $X_{TO}$ can be 0.2 um, 0.35 um, or 0.5 um.

The addition of the minimum copper termination structure at the end of a copper line in an integrated circuit is counter intuitive to the trend in integrated circuits to minimize the length of the copper lines used to form the circuit. However it is believed that the minimum termination copper structure reduces the stress (and in particular shear stress) existing at the end of the copper interconnect line. This reduction in stress will reduce the initiation of crack propagation that eventually leads to the delamination of the copper line. The delamination problem will become more severe as the dielectric constant of the material in which the copper line is formed is lowered.

We claim:

1. A method for forming a copper interconnect layer, comprising:
   forming a first copper region over a semiconductor;
   forming a low K dielectric layer over said copper region;
   forming a plurality of vias in a first region of said low K dielectric layer;
   forming a trench with a first edge in said low K dielectric layer over said plurality of vias wherein said trench extends a minimum length of 0.2 µm beyond the edge α of a via closest to the first edge of said trench; and
   filling said trench and said plurality of vias with copper.

2. The method of claim 1 wherein said trench is formed with a first depth d1 in said first region and a second depth d2 at said trench edge wherein d1 is greater than d2.

3. The method of claim 1 wherein said plurality of vias are separated by a distance less than 1.0 um.

4. A method for forming integrated circuit copper interconnects, comprising:
   forming a first copper region over a semiconductor;
   forming a low K dielectric layer over said copper region;
   forming a plurality of vias in a first region of said low K dielectric layer wherein said plurality of vias are separated by a distance less than 1.0 um;
   forming a trench with a first edge in said low K dielectric layer with a first depth d1 in said first region and a second depth d2 at said trench edge over said plurality of vias wherein d1 is greater than d2, and said trench extends a minimum length of 0.2 um beyond the edge a of a via closest to the first edge of said trench; and
   filling said trench and said plurality of vias with copper wherein said copper used to fill said vias contacts said first copper region.

* * * * *